US009563504B2

(12) United States Patent
Liang et al.

(10) Patent No.: US 9,563,504 B2
(45) Date of Patent: Feb. 7, 2017

(54) PARTIAL BLOCK ERASE FOR DATA REFRESHING AND OPEN-BLOCK PROGRAMMING

(71) Applicant: SANDISK TECHNOLOGIES INC., Plano, TX (US)

(72) Inventors: Guirong Liang, Santa Clara, CA (US); Zhenming Zhou, San Jose, CA (US); Masaaki Higashitani, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/863,584

(22) Filed: Sep. 24, 2015

(65) Prior Publication Data
US 2016/0163393 A1    Jun. 9, 2016

Related U.S. Application Data

(60) Provisional application No. 62/088,020, filed on Dec. 5, 2014.

(51) Int. Cl.
| G06F 11/10 | (2006.01) |
| G11C 16/14 | (2006.01) |
| G11C 16/26 | (2006.01) |
| G11C 16/34 | (2006.01) |

(Continued)

(52) U.S. Cl.
CPC ....... *G06F 11/1068* (2013.01); *G11C 11/5628* (2013.01); *G11C 16/14* (2013.01);
(Continued)

(58) Field of Classification Search
CPC .............. G06F 11/1068; G06F 11/1048; G11C 16/349; G11C 16/14; G11C 16/3418; G11C 16/26; G11C 16/3427; G11C 5/063; G11C 16/0483; H01L 27/11524
See application file for complete search history.

(56) References Cited

U.S. PATENT DOCUMENTS

| 6,763,424 B2 | 7/2004 | Conley |
| 7,477,547 B2 | 1/2009 | Lin |
| 7,804,718 B2 | 9/2010 | Kim |
| 8,839,071 B2 | 9/2014 | Jo |
| 9,183,944 B2 * | 11/2015 | Kim .................... G11C 16/3427 |

(Continued)

OTHER PUBLICATIONS

PCT International Search Report and Written Opinion of the International Searching Authority, dated Jan. 21, 2016, PCT Patent Application PCT/US2015/054459.

*Primary Examiner* — Richard Elms
*Assistant Examiner* — Ajay Ojha
(74) *Attorney, Agent, or Firm* — Vierra Magen Marcus LLP

(57) ABSTRACT

Systems and methods for performing partial block erase operations on a subset of word lines within a memory array prior to performing data refreshing or open-block programming are described. In some cases, data stored in memory cells connected to a word line with a fail bit count above an error threshold (e.g., more than two bit errors per page or more than three bit errors per word line) may be refreshed by performing a read operation on the memory cells, generating corrected data for the memory cells, performing a partial block erase operation on one or more word lines including the word line, and then writing the corrected data into the memory cells. The one or more word lines may include the word line with the fail bit count above the error threshold and an adjacent word line that is adjacent to the word line.

20 Claims, 12 Drawing Sheets

(51) Int. Cl.
*G11C 11/56* (2006.01)
*G11C 5/06* (2006.01)
*G11C 16/04* (2006.01)
*H01L 27/115* (2006.01)

(52) U.S. Cl.
CPC ............ *G11C 16/26* (2013.01); *G11C 16/349* (2013.01); *G11C 16/3418* (2013.01); *G06F 11/1048* (2013.01); *G11C 5/063* (2013.01); *G11C 16/0483* (2013.01); *G11C 16/3427* (2013.01); *G11C 2211/5644* (2013.01); *H01L 27/11524* (2013.01)

(56) References Cited

U.S. PATENT DOCUMENTS

| | | |
|---|---|---|
| 2008/0175054 A1 | 7/2008 | Hancock |
| 2008/0219053 A1* | 9/2008 | Kim .................. G11C 16/0483 365/185.11 |
| 2009/0132875 A1 | 5/2009 | Kitahara et al. |
| 2010/0107021 A1* | 4/2010 | Nagadomi .......... G06F 11/1068 714/704 |
| 2010/0157671 A1 | 6/2010 | Mokhlesi |
| 2010/0202203 A1 | 8/2010 | Choi |
| 2013/0070530 A1* | 3/2013 | Chen ...................... G11C 5/063 365/185.11 |
| 2014/0063938 A1* | 3/2014 | Oh .................... H01L 27/11524 365/185.02 |
| 2014/0115419 A1* | 4/2014 | Ahn .................... G06F 11/1048 714/758 |
| 2014/0301130 A1 | 10/2014 | Siau |
| 2015/0082120 A1 | 3/2015 | Yang |

\* cited by examiner

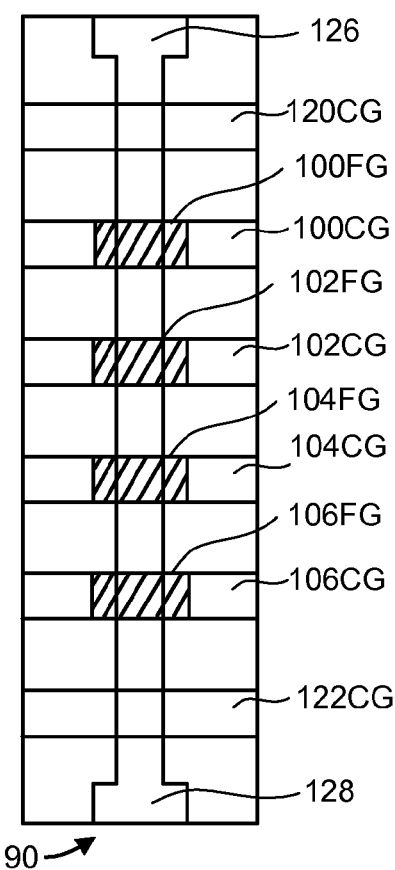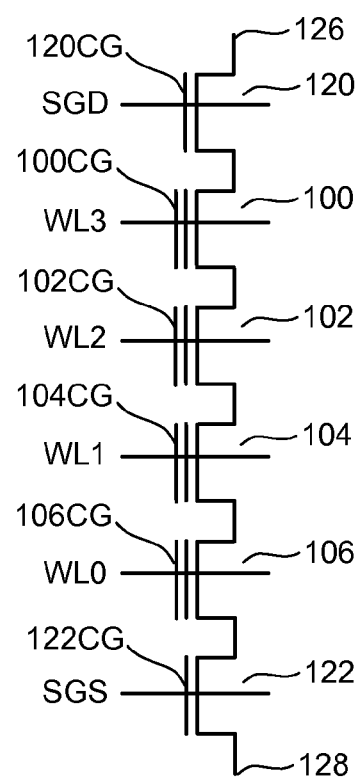
FIG. 1  FIG. 2

First programming pass

Second programming pass

US 9,563,504 B2

PARTIAL BLOCK ERASE FOR DATA REFRESHING AND OPEN-BLOCK PROGRAMMING

CLAIM OF PRIORITY

The present application claims priority to U.S. Provisional Application No. 62/088,020, entitled "Partial Block Erase for Data Refreshing and Open-Block Programming," filed Dec. 5, 2014, which is herein incorporated by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased variability in transistor characteristics over process, voltage, and temperature variations and increased floating-gate to floating-gate coupling between adjacent floating-gate transistors.

BRIEF DESCRIPTION OF THE DRAWINGS

FIG. 1 depicts one embodiment of a NAND string.
FIG. 2 depicts one embodiment of the NAND string of FIG. 1 using a corresponding circuit diagram.

DETAILED DESCRIPTION

Figure 3A:
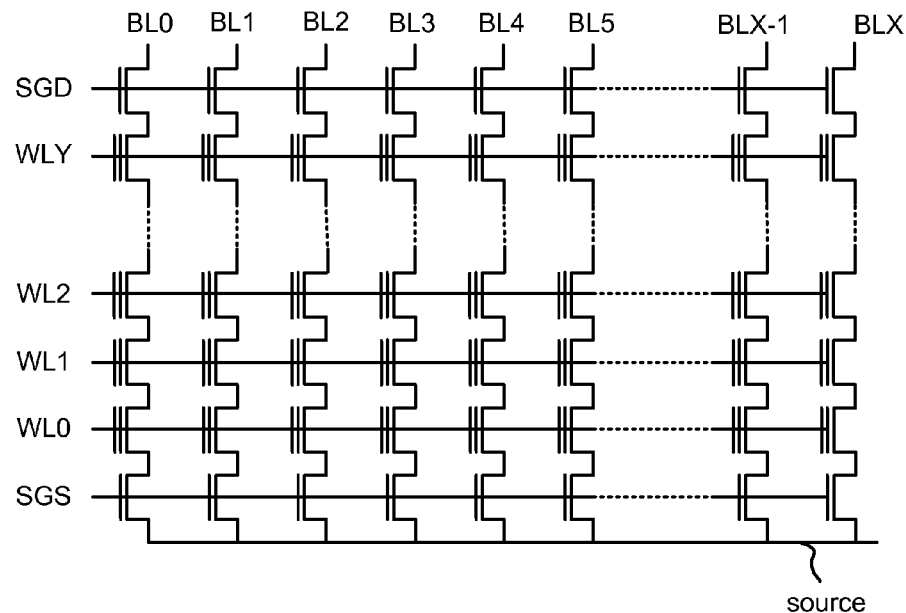
FIG. 3A depicts one embodiment of a memory block including a plurality of NAND strings.

Technology is described for performing partial block erase operations on a subset of word lines within a memory array prior to performing data refreshing or programming (e.g., the subset of word lines may comprise less than all of the word lines in the memory array). The memory array may comprise various memory structures including planar NAND structures, vertical NAND structures, Bit Cost Scalable (BiCS) NAND structures, 3D NAND structures, or 3D ReRAM structures. In some cases, data stored in memory cells connected to a word line with a fail bit count above an error threshold (e.g., more than two bit errors per page or more than three bit errors per word line) may be refreshed by performing a read operation on the memory cells, generating corrected data for the memory cells (e.g., by generating the corrected data using ECC information associated with the data stored in the memory cells), performing a partial block erase operation on one or more word lines including the word line, and then writing the corrected data into the memory cells. In one example, the one or more word lines may include the word line with the fail bit count above the error threshold and an adjacent word line that is adjacent to the word line (e.g., a drain-side word line or a source-side word line arranged next to the word line). In this case, data stored within memory cells connected to the word line and the adjacent word line may be refreshed even if the word line corresponds with a fail bit count above the error threshold and the adjacent word line does not correspond with a fail bit count above the error threshold.

In some embodiments, the data stored in memory cells corresponding with a word line with a bit-error-rate (BER) or a fail bit count (FBC) above an error threshold may be refreshed to compensate for the effects of read disturb and/or program disturb on the data integrity of the data stored in the memory cells. In one example, during a read operation, as a page of data is being read from memory cells within a memory array, the page of data may be buffered and a number of bit errors or a fail bit count may be determined for the page of data (e.g., two bit errors out of a 1 KB or 2 KB page size) based on ECC information associated with the page of data. The number of bit errors that may be tolerated before performing a data refresh may depend on the number of bits that can be corrected using the ECC information. If the number of bit errors or the fail bit count is greater than a threshold number, then a data refresh may be triggered causing corrected data to be generated using the ECC information and written to the memory cells. In some cases, a word line connected to the memory cells and/or one or more other word lines within the memory array may be erased using partial block erase operations and reprogrammed. The number of word lines that are erased and reprogrammed may be determined based on a number of program/erase cycles for the word line triggering the data refresh or based on a number of program/erase cycles for a set of one or more word lines within a memory array or a memory block (e.g., a set of 10 word lines within a memory block).

In some cases, if the word line triggering a data refresh has been erased at most a refreshing threshold number of times (e.g., at most five times), then only the word line triggering the data refresh may be reprogrammed; however, if the word line triggering the data refresh has been erased more than the refreshing threshold number of times, then both the word line triggering the data refresh and an adjacent word line (e.g., a drain-side word line) to the word line may be erased and reprogrammed. In some cases, if the word line triggering the data refresh has been erased more than the refreshing threshold number of times, then the word line triggering the data refresh and one or more other word lines (e.g., three drain-side word lines) may be erased and reprogrammed. The refreshing threshold may be set or adjusted over time based on a temperature associated with a memory block, the number of program/erase cycles for the word line triggering the data refresh, the number of program/erase cycles for the memory block, the number of previous data refreshes that have occurred to the word line triggering the data refresh, or the number of data refreshes that have occurred to the memory block. In one example, the refreshing threshold may be set to a first value if the number of partial block erases for a memory block is at most a first number of cycles (e.g., the memory block has had at most ten partial block erases) and set to a second value greater than the first value if the number of partial block erases for the memory block is greater than the first number of cycles. A partial block erase operation may comprise an erase operation in which less than all of the word lines within a memory block are erased during the erase operation. In one example, a partial block erase operation may cause memory cells connected to four word lines out of 48 total word lines within a memory block to be erased. A partial block erase operation may comprise an erase operation in which less than all of the memory cells within a memory block are erased during the erase operation.

A partial block erase operation may be performed by biasing one or more word lines within a memory block to be erased with 0V or a negative voltage, biasing one or more other word lines within the memory block that are not to be erased with a high voltage (e.g., 15V or another voltage greater than the voltage applied to the one or more word lines to be erased) or floating the one or more other word lines, and biasing a well (e.g., a p-well) of the memory block to an erase voltage (e.g., 15V or 20V). In one example, the one or more word lines within the memory block to be erased may be pulsed with one or more erase pulses (e.g., pulsing from 15V to 0V) during the partial block erase operation. In one example, a partial block erase operation may cause memory cells connected to only one word line within a memory block to be erased. In another example, a partial block erase operation may cause memory cells connected to a set of word lines less than all of the word lines within a memory block to be erased.

In some embodiments, prior to performing a programming operation, such as an open-block programming operation on memory cells connected to unprogrammed word lines within an open block (i.e., a memory block that includes unprogrammed word lines that have not yet been programmed since a last erase operation on the unprogrammed word lines), a partial block erase operation may be performed on the memory cells connected to the unprogrammed word lines. The partial block erase operation may be part of a process for tightening the erase distributions of the memory cells connected to the unprogrammed word lines. By performing the partial block erase operation on the memory cells connected to the unprogrammed word lines, the number of erase state to A-state failures on the unprogrammed word lines during the programming operation may be reduced. Furthermore, the read cycle limit may be reduced or reset for the unprogrammed word lines after the partial block erase operation has been performed and before an open-block is closed (i.e., after every word line in the memory block has been programmed). After the memory cells connected to the unprogrammed word lines have been erased, the memory cells may be programmed with new data during a programming operation without requiring the new data to be copied to another memory block.

In some cases, prior to performing a programming operation on memory cells connected to unprogrammed word lines within a memory block, the unprogrammed word lines may be read to determine a number of fail bits for the memory cells or a number of memory cells that correspond with threshold voltages outside of the target threshold voltage distribution for erased memory cells. If the number of fail bits or the number of memory cells with threshold voltages outside of the target threshold voltage distribution for erased memory cells is above a threshold number (e.g., more than three memory cells), then a partial block erase operation may be performed on the memory cells connected to the unprogrammed word lines prior to performing the programming operation on the memory cells. The shifting in threshold voltages for the memory cells connected to the unprogrammed word lines may be caused by programming operations and/or read operations occurring to source-side word lines. Erasing the memory cells connected to the unprogrammed word lines prior to performing a programming operation may allow a maximum read cycle count to be reduced or reset for the unprogrammed word lines. In one example, a partial block erase operation may be performed on the unprogrammed word lines if a particular number of reads have occurred to the memory block including the unprogrammed word lines, if a particular number of reads have occurred to a portion of the memory block (e.g., have occurred to a particular word line within the memory block), or prior to programming the unprogrammed word lines within the memory block if a number of fail bits for the unprogrammed word lines exceeds a fail bit threshold. The fail bit threshold may be set or adjusted over time based on a temperature associated with the memory block, the number of program/erase cycles for the memory block, or the number of data refreshes that have occurred to the memory block.

One issue affecting NAND flash memory is that program disturb and read disturb have become worse due to scaling, especially after a number of program/erase cycles have occurred. One benefit of performing partial block erase operations on a subset of word lines within a memory array prior to performing data refreshing (e.g., after data has already been stored within memory cells) or prior to programming (e.g., before data has been stored within memory cells) is that the data integrity of the data stored within memory cells of the memory array may be improved.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure. In some embodiments, the transistors within a NAND string may comprise transistors with a charge trapping layer.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) may require more die area, an increase in the number of fabrication layers, or an increase in the height of a memory device. Therefore, from an integrated circuit area standpoint, it may be beneficial to only use one drain-side selection gate for each NAND string and then connect each NAND string of the pair with only one of the two drain-side selection signals.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate (or into a charge storage layer, such as a silicon nitride charge trapping layer) via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. In the case of a vertical memory device (e.g., BiCS or other type of 3D NAND), the vertical channel in the memory string may be electrically connected to the substrate (e.g., via a p-well in the substrate) at the bottom of the memory hole (e.g., located below the SGS transistor). These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
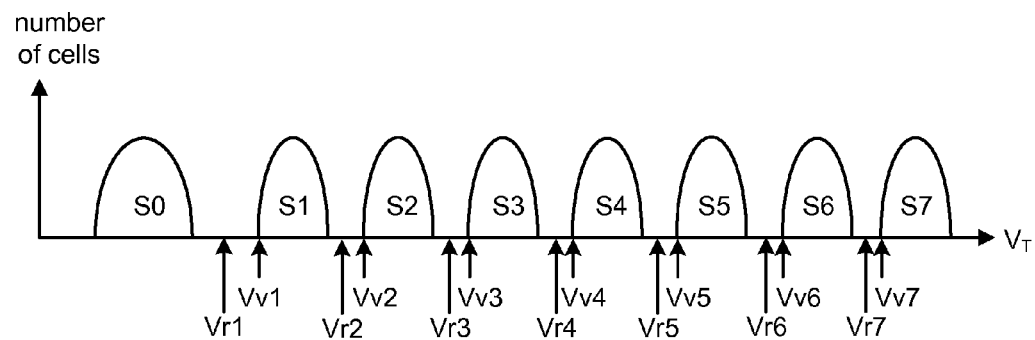
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some cases, the memory cells may be erased to state S0. From state S0, the memory cells may be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
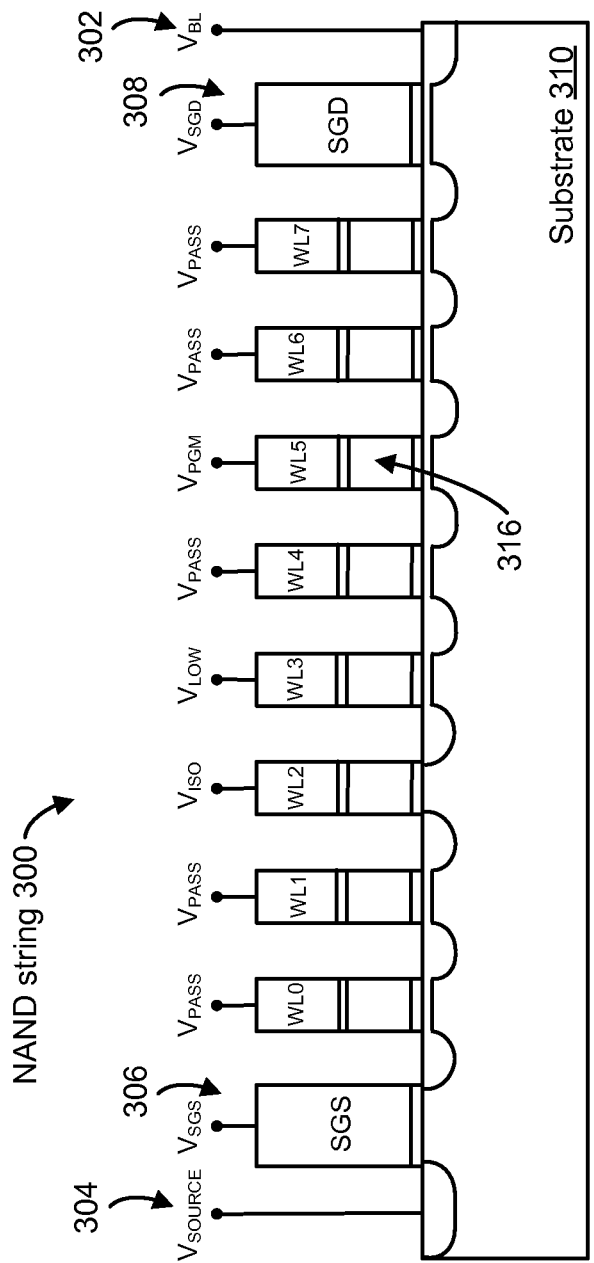
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a p-well 310. $V_{SGS}$ may be applied to the source-side select gate 306 and $V_{SGD}$ may be applied to the drain-side select gate 308. The bit line 302 may be biased to VBA and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, $V_{PASS}$, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

Figure 3D:
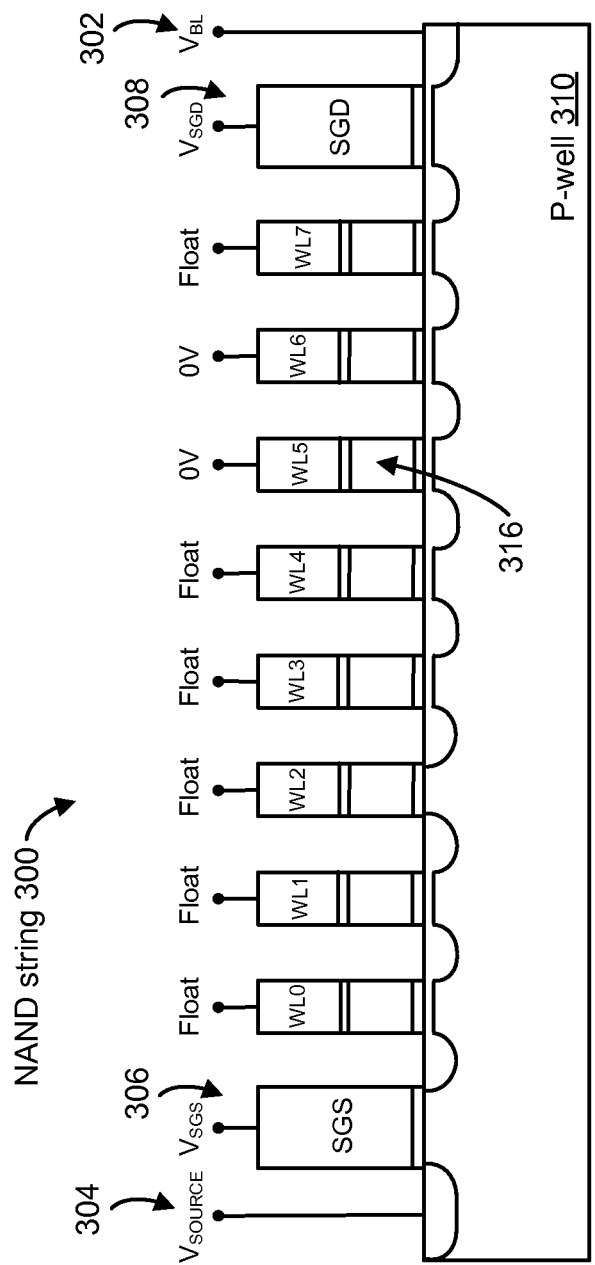
FIG. 3D depicts one embodiment of a NAND string during an erase operation.

FIG. 3D depicts one embodiment of a NAND string 300 during an erase operation. The p-well 310 may be biased to an erase voltage (e.g., 20V) during the erase operation while selected word lines corresponding with memory cells to be erased are biased to 0V. The erase operation may comprise a partial block erase operation as only the storage elements connected to word lines WL5-WL6 are being erased, while all other storage elements connected to word lines WL0-WL4 and WL7 are not being erased. The nodes corresponding with $V_{BL}$, $V_{SOURCE}$, $V_{SGS}$, and $V_{SGD}$ may also be floated during the erase operation.

Figure 4A:
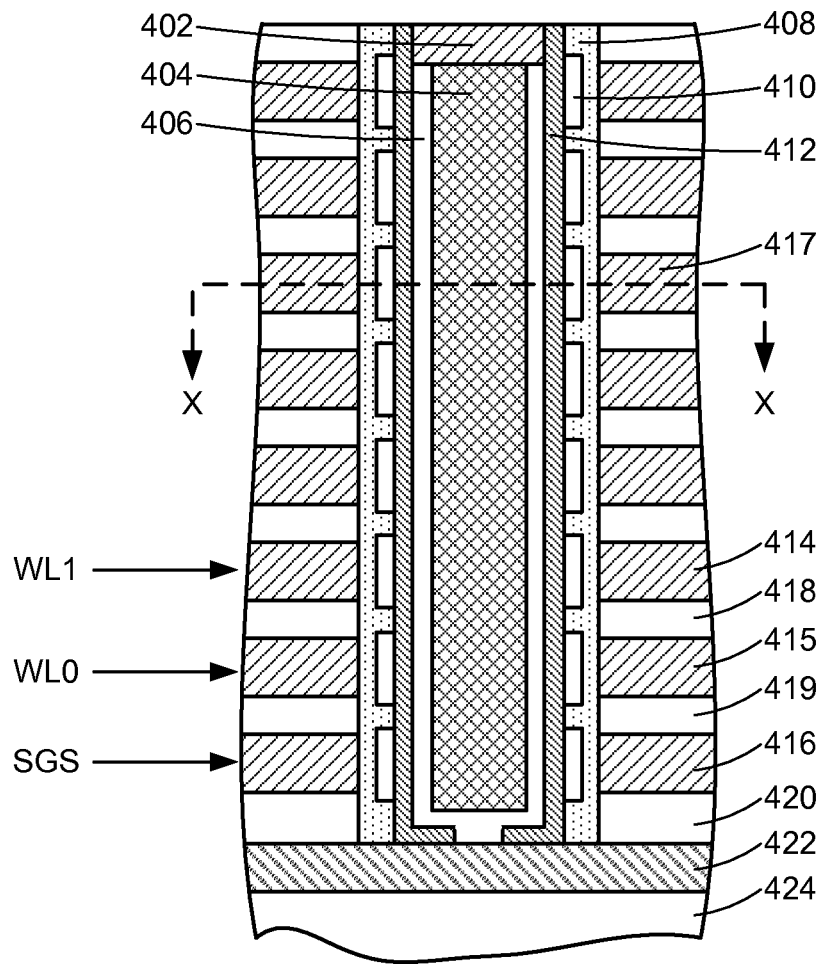
FIG. 4A depicts one embodiment of a vertical NAND structure.

FIG. 4A depicts one embodiment of a vertical NAND structure. The vertical NAND structure includes a vertical NAND string formed above the substrate 424 and oriented such that the vertical NAND string is orthogonal to the substrate 424. The vertical NAND string may be arranged within a vertical memory hole that is etched through alternating layers of control gate material (e.g., tungsten or polysilicon) and inter-gate insulator material (e.g., oxide or silicon oxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a dielectric material 408 (e.g., oxide or a stack of dielectric layers, such as layers of $Al_2O_3$ and $SiO_2$), a floating gate material 410 (e.g., polysilicon), a tunneling layer material 412 (e.g., a thin oxide), and a channel layer material 406 (e.g., undoped polysilicon) may be deposited within the memory hole and arranged in order to form the vertical NAND string. The tunneling layer material 412 may comprise a portion of a multi-layer dielectric stack such as an ONO dielectric stack, which includes alternating layers of silicon dioxide ("O") and silicon nitride ("N"). In some cases, a core material layer 404 (e.g., oxide) may be formed within the memory hole. In other cases, the core material layer 404 may be omitted. A bit line contact layer 402 may be formed at the top of the memory hole and connect to the channel layer material 406. The channel layer material 406 may connect to the source line layer 422 at the bottom of the memory hole. Thus, in this case, the bit line contact layer 402 connects to the vertical NAND string at the top of the memory hole and the source line contact layer 422 connects to the vertical NAND string at the bottom of the memory hole. In some embodiments, the floating gate material 410 may be replaced with a charge storage material or a charge trapping layer (e.g., silicon nitride).

Figure 4B:
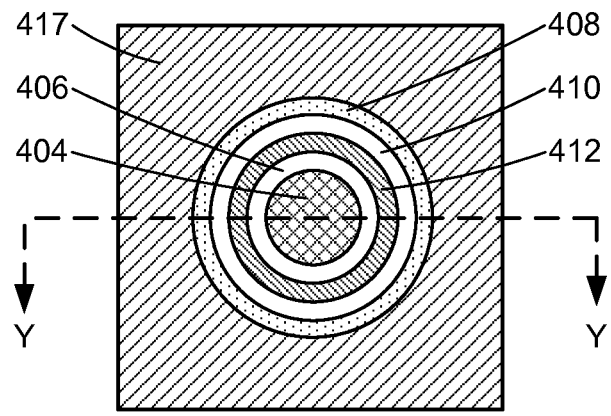
FIG. 4B depicts one embodiment of a cross-sectional view taken along line X-X of FIG. 4A.

FIG. 4B depicts one embodiment of a cross-sectional view taken along line X-X of FIG. 4A. As depicted, the vertical NAND string includes an inner core material layer 404 that is surrounded by the channel layer material 406 that is surrounded by the tunneling layer material 412 that is surrounded by the floating gate material 410 that is surrounded by the dielectric material 408 that is surrounded by the control gate material layer 417. In one embodiment, FIG. 4A may depict a cross-sectional view taken along line Y-Y of FIG. 4B. In one embodiment, the vertical NAND string may be formed using a vertical cylindrical structure or a vertical tapered cylindrical structure. In this case, the dielectric material 408, floating gate material 410, tunneling layer material 412, and channel layer material 406 of the vertical NAND string may comprise vertical annular structures surrounding the core material layer 404. In another embodiment, the vertical NAND string may be formed using a vertical pillar structure or a vertical rectangular prism structure.

Figure 5:
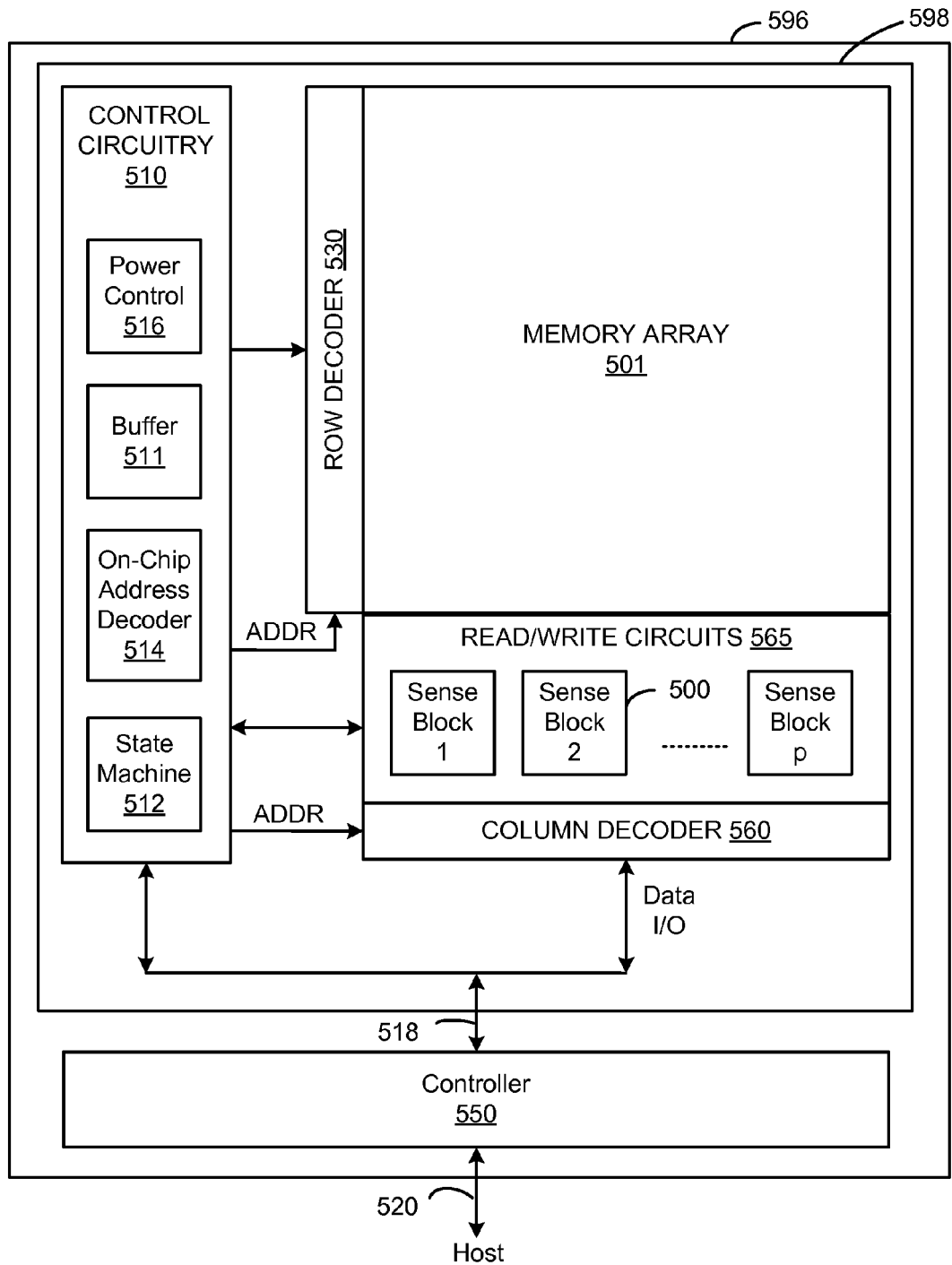
FIG. 5 depicts one embodiment of a non-volatile storage system.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

In some cases, the controller 550 may work in conjunction with the control circuitry 510 to read and/or write data from the memory array 501. In one example, data to be written into the memory array 501 may be buffered by controller 550 and error correcting code (ECC) data may be generated corresponding with the data to be written. The ECC data, which allows data errors that occur during transmission or storage to be detected and/or corrected, may be written to the memory array 501 or stored in non-volatile memory within controller 550. In one embodiment, the ECC data may be generated and data errors may be corrected by circuitry within controller 550. The controller 550 may configure the control circuitry 510 to perform various memory operations on the memory array 501. In one example, a host may issue a programming command and in response, controller 550 may configure the control circuitry to perform a read operation (e.g., to read the sideband or overhead area located at the end of a page to confirm that the page has not been marked defective and can be written to) followed by a programming operation.

The control circuitry 510 configures the read/write circuits 565 to perform memory operations on the memory array 501. The control circuitry 510 includes a state machine 512, an on-chip address decoder 514, buffer 511, and a power control module 516. The buffer 511 may comprise an SRAM or a page register for storing one or more pages of data. The state machine 512 provides chip-level control of memory operations. In one example, state machine 512 may cause various voltages to be applied to control lines (e.g., selected word lines and unselected word lines) within the memory array 501 corresponding with a particular memory operation (e.g., a read or write operation). The state machine 512 may implement control logic for controlling read, write, or erase operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that may generate voltages greater than the supply voltage and one or more voltage regulators for generating various voltages, such as voltages used during programming, erase, and read operations.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, buffer 511, read/write circuits 565, controller 550, and so forth. The one or more managing circuits may perform or facilitate one or more memory array operations including erasing, programming, or reading operations.

The memory die 598 may include a read circuit, a write circuit, and an erase circuit. The read circuit, write circuit, and erase circuit may share components or circuitry in order to implement control logic for performing read, write, or erase operations on the memory array 501. The read circuit, write circuit, and erase circuit may be part of one or more managing circuits for facilitating one or more memory array operations including erasing, programming, or reading operations.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
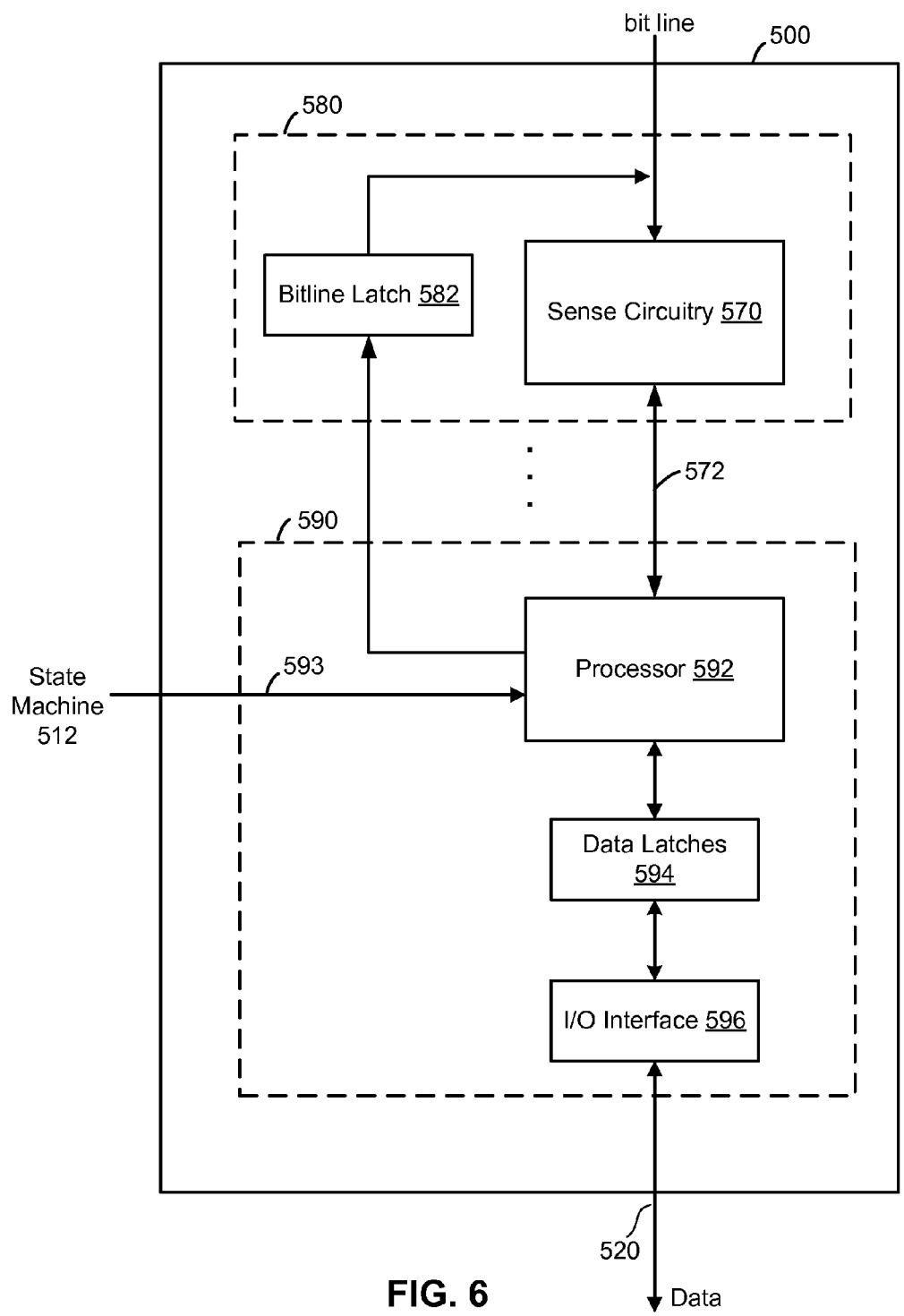
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
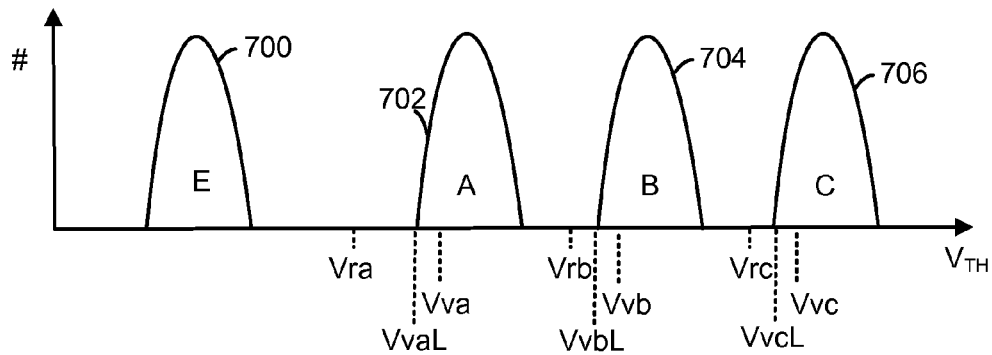
FIG. 7A depicts one embodiment of a set of threshold voltage distributions for a four-state memory device in which each storage element stores two bits of data.

FIG. 7A depicts one embodiment of a set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 7F, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
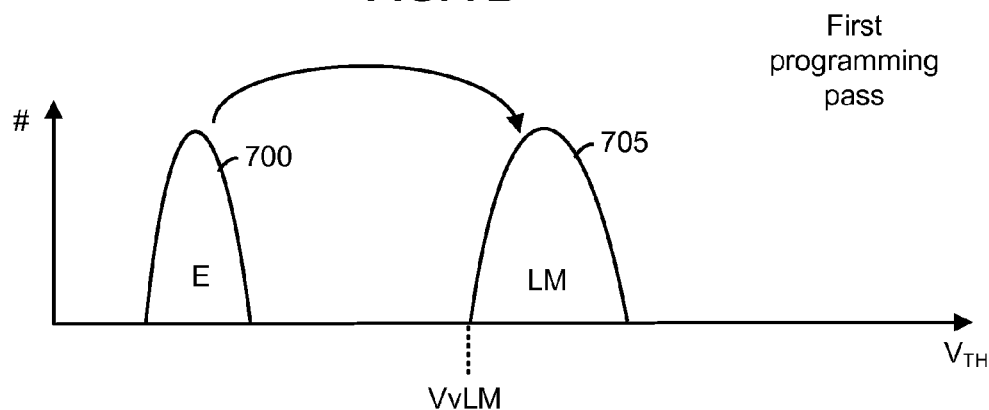
FIG. 7B depicts one embodiment of a first pass of a two-pass programming technique.

FIG. 7B depicts one embodiment of a first pass of a two-pass programming technique. In this example, a multi-state storage element stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower-middle) state (distribution 705).

In one embodiment, after a storage element is programmed from the E-state to the LM-state, its neighbor storage element on an adjacent word line WLn+1 in the NAND string will then be programmed with respect to its lower page in a respective first programming pass of the adjacent word line.

Figure 7C:
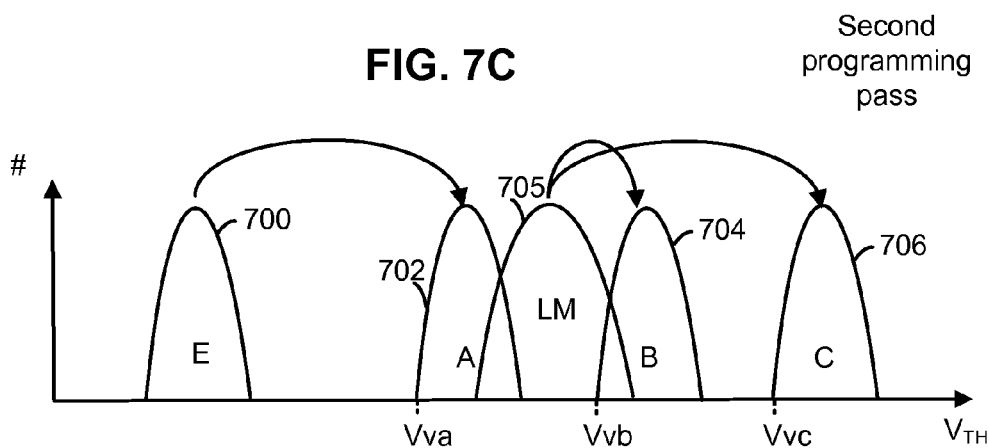
FIG. 7C depicts one embodiment of a second pass of the two-pass programming technique.

FIG. 7C depicts one embodiment of a second pass of the two-pass programming technique referred to in FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706.

Figure 7D:
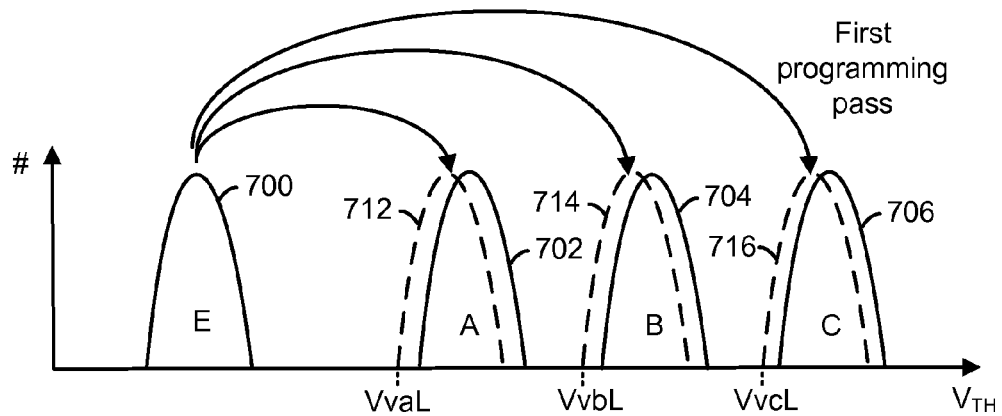
FIG. 7D depicts one embodiment of a first pass of another two-pass programming technique.

FIG. 7D depicts one embodiment of a first pass of another two-pass programming technique. In this example, referred to as foggy-fine (or course-fine) programming, the A-state, B-state and C-state storage elements are programmed from the E-state to distributions 712, 714 and 716, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 7E:
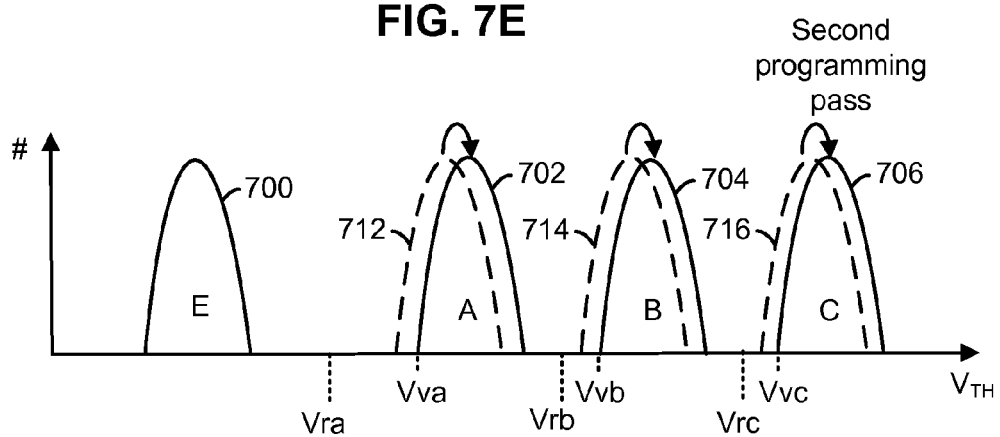
FIG. 7E depicts one embodiment of a second pass of the two-pass programming technique.
Figure 7F:
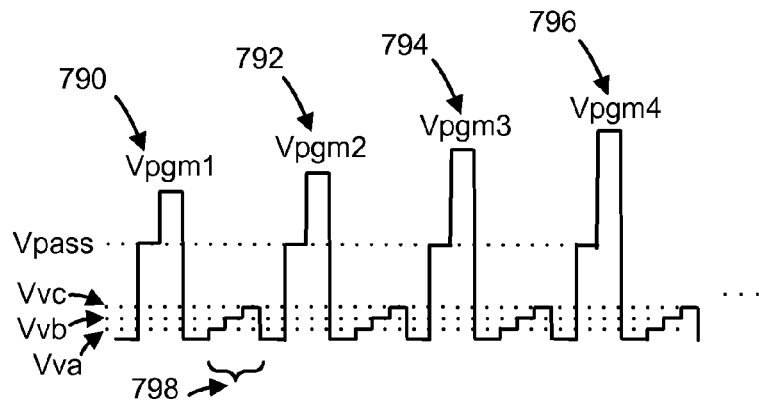
FIG. 7F depicts one embodiment of a series of program and verify pulses which are applied to a selected word line during a programming operation.

FIG. 7E depicts one embodiment of a second pass of the two-pass programming technique referred to in FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state. Programming techniques which measure storage element current may be used as well. The concepts described herein may be adapted to the different programming techniques.

FIG. 7F depicts one embodiment of a series of program and verify pulses which are applied to a selected word line during a programming operation. A programming operation may include multiple program-verify iterations, in which each iteration applies one or more programming voltages followed by one or more verify voltages to the selected word line. In one embodiment, the programming voltages applied in a previous iteration may be stepped up in successive iterations. Moreover, the one or more programming voltages applied during a programming iteration may include a first portion which has a pass voltage (Vpass) level, e.g., 6-8 V, followed by a second, highest amplitude portion at a program level, e.g., 12-25 V. For example, a first, second, third and fourth program pulses 790, 792, 794 and 796 have program levels of Vpgm1, Vpgm2, Vpgm3 and Vpgm4, respectively. One or more verify voltages 798, such as verify voltages Vva, Vvb and Vvc, may be provided after each program pulse. In some cases, one or more initial program pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

Figure 8:
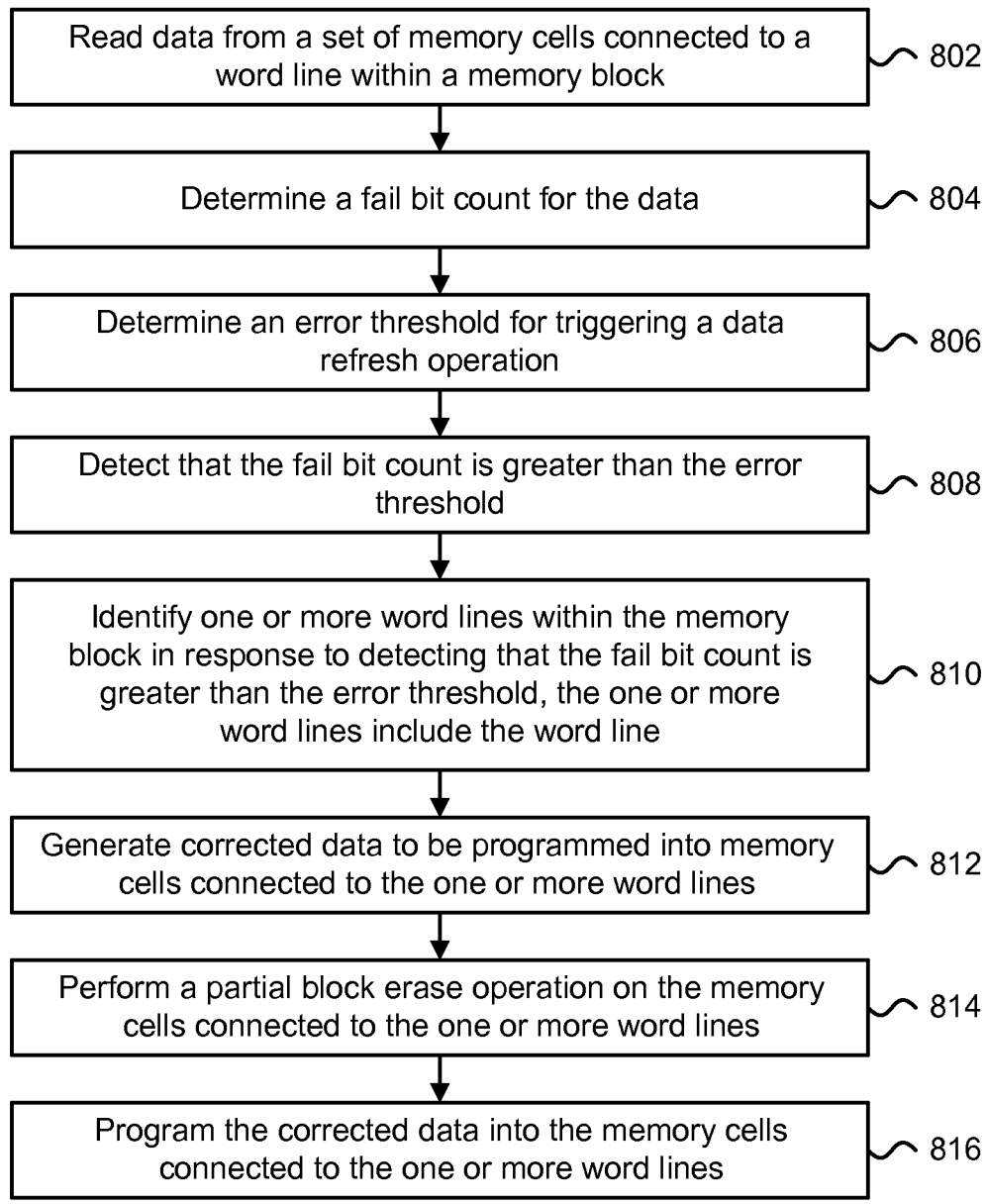
FIG. 8 is a flowchart describing one embodiment of a process for performing a data refresh operation.

FIG. 8 is a flowchart describing one embodiment of a process for performing a data refresh operation. In one embodiment, the process of FIG. 8 may be performed by a non-volatile storage system, such as non-volatile storage system 596 in FIG. 5.

In step 802, data from a set of memory cells connected to a word line within a memory block is determined (e.g., the data may be read from the set of memory cells). The memory block may include a NAND flash memory structure, such as a vertical NAND structure or a bit cost scalable (BiCS) NAND structure. The data may correspond with a page of data (e.g., 1 KB or 2 KB of data). In step 804, a fail bit count for the data is determined. The fail bit count may correspond with a number of bit errors that have been detected within the data. In one example, an ECC code or ECC information associated with the data may be used to determine the fail bit count or the number of bit errors that have occurred within the data.

In step 806, an error threshold is determined. The error threshold may be used for determining when a data refresh operation should be triggered. In one embodiment, the error threshold may be determined based on a temperature associated with a memory block, the number of program/erase cycles for the word line triggering the data refresh, the number of program/erase cycles for the memory block, the number of previous data refreshes that have occurred to the word line triggering the data refresh, and/or the number of data refreshes that have occurred to the memory block. The temperature associated with the memory block may be acquired via an on-chip temperature sensor. The number of program/erase cycles for the memory block may comprise the sum of all partial block erase operations that have been performed on the memory block. The number of data refreshes that have occurred to the memory block may comprise the sum of all data refreshes that have been performed on word lines within the memory block.

In some cases, the error threshold may be set to be less than or equal to a correctable number of bit errors. In one example, ECC information may be used to correct three bit errors within a page of data and the error threshold may be set to two bit errors. In one example, ECC information may be used to correct three bit errors within a page of data and the error threshold may be set to three bit errors.

In one embodiment, if the temperature associated with a memory block is above a temperature threshold (e.g., above 55 degrees Celsius), then the error threshold may be decreased from a first value (e.g., three errors per page) to a second value less than the first value (e.g., two errors per page). In another embodiment, if the number of program/erase cycles for the word line is above a program/erase threshold (e.g., more than five program/erase cycles have been performed on the word line), then the error threshold may be decreased from a first value (e.g., three errors per page) to a second value less than the first value (e.g., one error per page). In another embodiment, if the number of previous data refreshes for the word line is above a refresh threshold (e.g., more than ten data refreshes have been performed on the word line), then the error threshold may be decreased from a first value (e.g., three errors per word line) to a second value less than the first value (e.g., two errors per word line).

In step 808, it is detected that the fail bit count is greater than the error threshold. In step 810, one or more word lines within the memory block are identified in response to detecting that the fail bit count is greater than the error threshold. The one or more word lines may include the word line triggering the data refresh. The one or more word lines may be determined based on a number of program/erase cycles for the word line triggering the data refresh or based on a number of program/erase cycles for the one or more word lines. In one example, if the word line triggering the data refresh has been programmed and erased more than a threshold number of times (e.g., more than five times), then the one or more word lines may comprise the word line triggering the data refresh and one or more adjacent word lines arranged next to the word line (e.g., an adjacent drain-side word line).

In step 812, corrected data to be programmed into memory cells connected to the one or more word lines is generated. The corrected data may be generated using ECC information associated with the data read from the set of memory cells. The ECC information may be used to identify and correct one or more bit errors within the data read from the set of memory cells. In step 814, a partial block erase operation is performed on the memory cells connected to the one or more word lines. The one or more word lines may comprise less than all of the word lines in the memory block. In one example, the one or more word lines may comprise the word line and an adjacent word line adjacent to the word line (e.g., a source-side word line or a drain-side word line). In step 816, the corrected data is programmed into the memory cells connected to the one or more word lines.

Figure 9A:
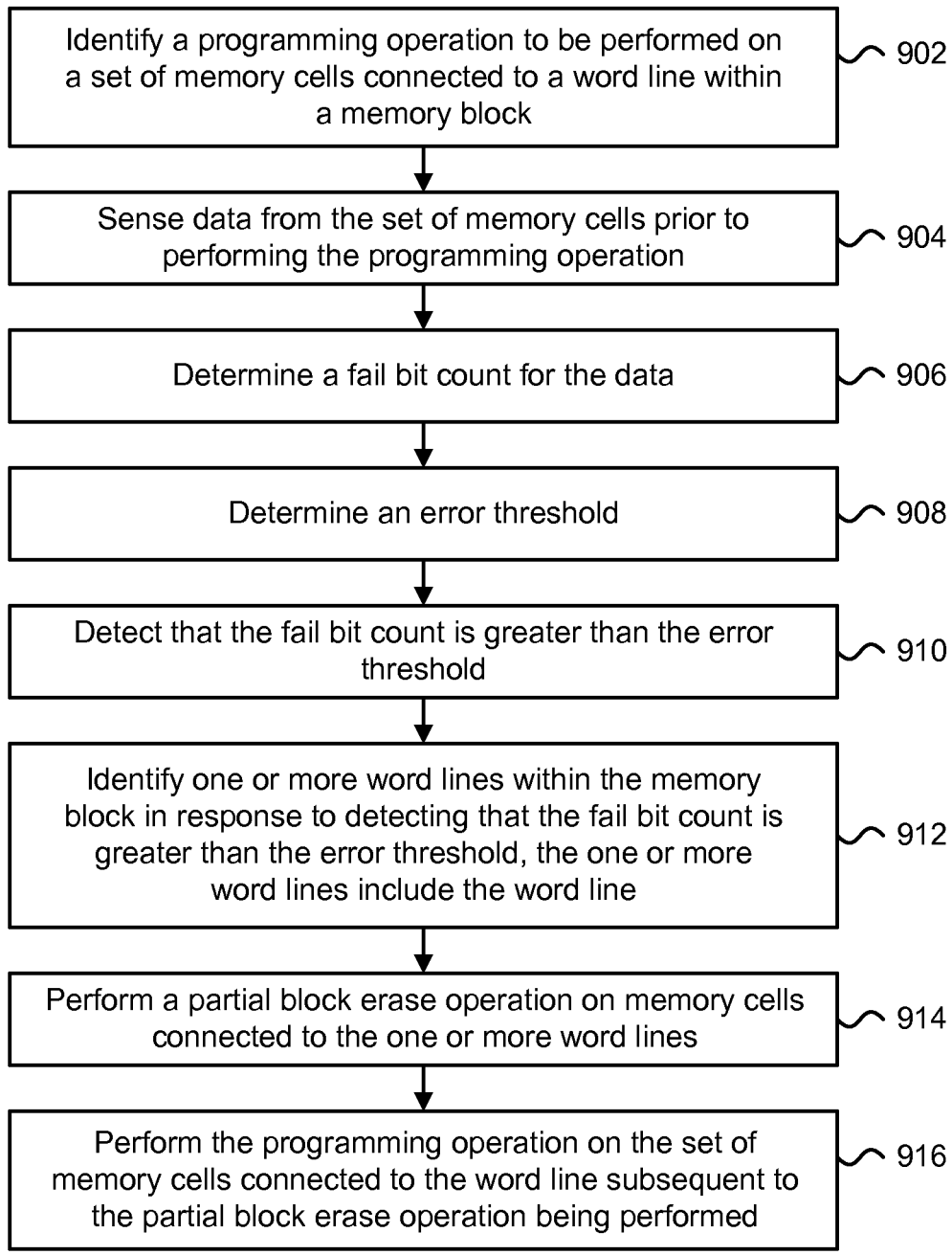
FIG. 9A is a flowchart describing one embodiment of a process for performing a programming operation.

FIG. 9A is a flowchart describing one embodiment of a process for performing a programming operation. In one embodiment, the process of FIG. 9A may be performed by a non-volatile storage system, such as non-volatile storage system 596 in FIG. 5.

In step 902, a programming operation to be performed on a set of memory cells connected to a word line within a memory block is identified. The programming operation may be identified via a memory operation command issued by a controller of a non-volatile storage system (e.g., a programming command or a read command). In some cases, the programming operation to be performed on the set of memory cells may be part of one or more memory operations associated with the memory operation command.

In step 904, data from the set of memory cells is sensed prior to performing the programming operation. The data from the set of memory cells may be used to determine a number of the set of memory cells that have threshold voltages outside of a target threshold voltage distribution for erased memory cells or outside of a threshold voltage range for erased memory cells. The data from the set of memory cells may be sensed prior to the set of memory cells being programmed from an erased state (e.g., none of the set of memory cells have been programmed since a previous erase operation). In step 906, a fail bit count for the data is determined. The fail bit count may correspond with a number of memory cells with threshold voltages outside of a threshold voltage range for erased memory cells. In one example, the fail bit count may correspond with the total number of memory cells out of the entire set of memory cells that have a threshold voltage greater than a particular voltage, such as 0V or 200 mV.

In step 908, an error threshold is determined. The error threshold may be used for determining when a partial block erase operation should be triggered and/or a retightening of an erase distribution should be performed. In one embodiment, the error threshold may be determined based on a temperature associated with a memory block, the number of program/erase cycles for the word line, and/or the number of program/erase cycles for the memory block as a whole. The temperature associated with the memory block may be acquired via an on-chip temperature sensor. The number of program/erase cycles for the memory block may comprise the sum of all partial block erase operations that have been performed on the memory block.

In one embodiment, if the temperature associated with a memory block is above a temperature threshold (e.g., above 85 degrees Celsius), then the error threshold may be decreased from a first value (e.g., three errors per word line) to a second value less than the first value (e.g., two errors per word line). In another embodiment, if the number of program/erase cycles for the word line is above a program/erase threshold (e.g., more than ten program/erase cycles have been performed on the word line), then the error threshold may be decreased from a first value (e.g., four errors per word line) to a second value less than the first value (e.g., one error per word line).

In step 910, it is detected that the fail bit count is greater than the error threshold. In step 912, one or more word lines within the memory block are identified in response to detecting that the fail bit count is greater than the error threshold. The one or more word lines may include the word line triggering the partial block erase operation. The one or more word lines may be determined based on a number of program/erase cycles for the word line or based on a number of program/erase cycles for the one or more word lines. In one example, if the word line triggering the partial block erase operation has been programmed and erased more than a threshold number of times (e.g., more than five times), then the one or more word lines may comprise the word line and one or more adjacent word lines arranged next to the word line. In another example, if the word line triggering the partial block erase operation has been programmed and erased more than a threshold number of times (e.g., more than ten times), then the one or more word lines may comprise the word line and all drain-side word lines arranged between the word line and the control signal for the drain-side select gate (e.g., SGD). In step 914, a partial block erase operation is performed on memory cells connected to the one or more word lines. The one or more word lines may comprise less than all of the word lines within the memory block. In this case, the memory cells connected to the one or more word lines may be erased while other data stored in other memory cells connected to other word lines within the memory block are not erased. In step 916, the programming operation on the set of memory cells connected to the word line is performed subsequent to the partial block erase operation being performed in step 914. The programming operation may comprise writing data into the set of memory cells.

Figure 9B:
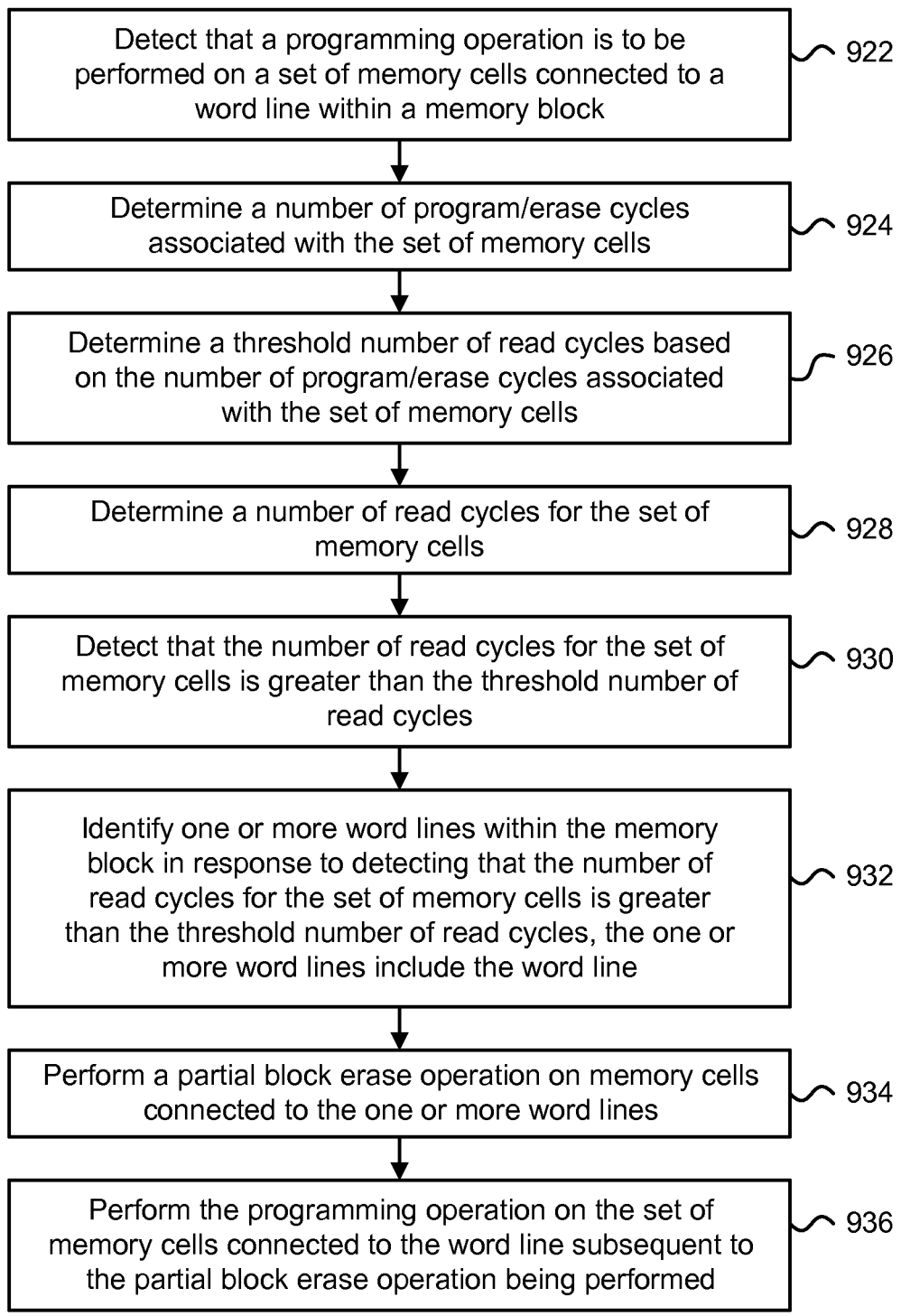
FIG. 9B is a flowchart describing an alternative embodiment of a process for performing a programming operation.

FIG. 9B is a flowchart describing an alternative embodiment of a process for performing a programming operation. In one embodiment, the process of FIG. 9B may be performed by a non-volatile storage system, such as non-volatile storage system 596 in FIG. 5.

In step 922, it is detected that a programming operation is to be performed on a set of memory cells connected to a word line within a memory block. The programming operation may be detected or identified prior to being performed by a controller that controls memory operations performed on a memory array. In some cases, the programming operation to be performed on the set of memory cells may be part of one or more memory operations performed on the memory array.

In step 924, a number of program/erase cycles associated with the set of memory cells is determined. The number of program/erase cycles may correspond with the total number of program/erase cycles that the set of memory cells have experienced since being fabricated. In one example, if the set of memory cells have experienced ten erase operations since being fabricated, then the number of program/erase cycles may be ten. In step 926, a threshold number of read cycles is determined based on the number of program/erase cycles associated with the set of memory cells. In one example, if the number of program/erase cycles associated with the set of memory cells is more than five (or a predefined number), then the threshold number of read cycles may comprise a first number of read cycles (e.g., fifteen read cycles); otherwise, if the number of program/erase cycles associated with the set of memory cells is not more than five, then the threshold number of read cycles may comprise a second number of read cycles greater than the first number of read cycles (e.g., thirty read cycles).

In step 928, a number of read cycles for the set of memory cells is determined. In one example, the number of read cycles for the set of memory cells may comprise the total number of read cycles that have been performed on the set of memory cells since the set of memory cells were last erased (e.g., since the last partial block erase operation was performed on the set of memory cells). In step 930, it is detected that the number of read cycles for the set of memory cells is greater than the threshold number of read cycles.

In step 932, one or more word lines within the memory block are identified in response to detecting that the number of read cycles for the set of memory cells is greater than the threshold number of read cycles. The one or more word lines may include the word line triggering the partial block erase operation. The one or more word lines may be determined based on a number of program/erase cycles for the word line or based on a number of program/erase cycles for the one or more word lines. In one example, if the word line triggering the partial block erase operation has been programmed and erased more than a threshold number of times (e.g., more than five times), then the one or more word lines may comprise the word line and one or more adjacent word lines arranged next to the word line. In another example, if the word line triggering the partial block erase operation has been programmed and erased more than a threshold number of times (e.g., more than ten times), then the one or more word lines may comprise the word line and all drain-side word lines arranged between the word line and the control signal for the drain-side select gate (e.g., SGD).

In step 934, a partial block erase operation is performed on memory cells connected to the one or more word lines. The one or more word lines may comprise less than all of the word lines within the memory block. In this case, the memory cells connected to the one or more word lines may be erased while other data stored in other memory cells connected to other word lines within the memory block are not erased. In step 936, the programming operation on the set of memory cells connected to the word line is performed subsequent to the partial block erase operation being performed in step 934. The programming operation may comprise writing data into the set of memory cells.

One embodiment of the disclosed technology includes a memory array, a control circuit, an erase circuit, and a write circuit. The memory array includes a set of memory cells. The control circuit configured to identify one or more word lines within the memory array in response to detecting that a fail bit count associated with a first set of data stored within the set of memory cells satisfies an error threshold. The control circuit configured to acquire a second set of data to be programmed into memory cells connected to the one or more word lines. The erase circuit configured to erase the memory cells connected to the one or more word lines such that other memory cells connected to one or more other word lines within the memory array are not erased. The write circuit configured to write the second set of data into the memory cells connected to the one or more word lines. The memory array may comprise a memory block.

One embodiment of the disclosed technology includes a memory array, a control circuit, an erase circuit, and a write circuit. The memory array includes a set of memory cells connected to a word line. The control circuit configured to identify a programming operation to be performed on the set of memory cells and detect that a fail bit count associated with the set of memory cells is greater than an error threshold. The control circuit configured to identify one or more word lines within the memory array in response to detecting that the fail bit count is greater than the error threshold. The one or more word lines include the word line connected to the set of memory cells. The erase circuit configured to erase memory cells connected to the one or more word lines such that less than all of the memory cells within the memory array are erased. The write circuit configured to write data associated with the programming operation into the memory cells connected to the one or more word lines.

One embodiment of the disclosed technology includes a memory array and one or more managing circuits in communication with the memory array. The memory array includes a set of memory cells connected to a word line. The one or more managing circuits configured to read data from the set of memory cells and determine a fail bit count associated with the data. The one or more managing circuits configured to detect that the fail bit count is greater than an error threshold. The one or more managing circuits configured to identify one or more word lines within the memory array in response to detecting that the fail bit count is greater than the error threshold. The one or more word lines include the word line connected to the set of memory cells. The one or more managing circuits configured to generate corrected data to be programmed into memory cells connected to the one or more word lines. The one or more managing circuits configured to cause a partial block erase operation to be performed on the memory cells connected to the one or more word lines and configured to cause the corrected data to be programmed into the memory cells connected to the one or more word lines.

One embodiment of the disclosed technology includes acquiring or reading data from a set of memory cells connected to a word line within a memory block, determining a number of bit errors associated with the data, detecting that the number of bit errors is greater than an error threshold, and identifying one or more word lines within the memory block in response to detecting that the number of bit errors is greater than the error threshold. The one or more word lines include the word line connected to the set of memory cells. The method further comprises generating corrected data to be programmed into memory cells connected to the one or more word lines, performing a partial block erase operation on the memory cells connected to the one or more word lines, and programming the corrected data into the memory cells connected to the one or more word lines.

One embodiment of the disclosed technology includes a non-volatile storage system including a memory array and one or more managing circuits in communication with the memory array. The memory array includes a set of memory cells connected to a word line. The one or more managing circuits configured to identify a programming operation to be performed on the set of memory cells and sense data from the set of memory cells. The one or more managing circuits configured to determine a fail bit count for the data. The one or more managing circuits configured to detect that the fail bit count is greater than an error threshold and identify one or more word lines within the memory array in response to detecting that the fail bit count is greater than the error threshold. The one or more word lines include the word line connected to the set of memory cells. The one or more managing circuits configured to cause a partial block erase operation to be performed on memory cells connected to the one or more word lines and configured to cause the programming operation to be performed on the set of memory cells connected to the word line.

One embodiment of the disclosed technology includes detecting that a programming operation is to be performed on a set of memory cells connected to a word line within a memory block, determining a number of program/erase cycles associated with the set of memory cells, determining a threshold number of read cycles based on the number of program/erase cycles associated with a set of memory cells, determining a number of read cycles for the set of memory cells, detecting that the number of read cycles for the set of memory cells is greater than the threshold number of read cycles, and identifying one or more word lines within the memory block in response to detecting that the number of read cycles for the set of memory cells is greater than the threshold number of read cycles. The one or more word lines may include the word line connected to the set of memory cells. The method further comprises performing a partial block erase operation on memory cells connected to the one or more word lines and performing the programming operation on the set of memory cells connected to the word line subsequent to the partial block erase operation being performed. In some cases, the number of program/erase cycles associated with the set of memory cells may comprise the total number of times that the set of memory cells have been programmed and erased since the set of memory cells were fabricated.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system, comprising:
   a memory array, the memory array includes a set of memory cells connected to a word line;
   a control circuit configured to identify one or more word lines within the memory array in response to a fail bit count associated with a first set of data stored within the set of memory cells connected to the word line satisfies an error threshold, the control circuit configured to acquire a second set of data to be programmed into memory cells connected to the one or more word lines, the one or more word lines include the word line and a second word line that has not been programmed since a last erase operation on the second word line;
   an erase circuit configured to erase the memory cells connected to the one or more word lines such that other memory cells connected to one or more other word lines within the memory array are not erased; and
   a write circuit configured to write the second set of data into the memory cells connected to the one or more word lines.

2. The system of claim 1, wherein:
   the control circuit configured to detect that the word line has been erased at least a threshold number of times; and
   the erase circuit configured to erase memory cells connected to the second word line in response to detecting that the word line has been erased at least the threshold number of times and that the fail bit count associated with the first set of data exceeds the error threshold.

3. The system of claim 1, wherein:
   the control circuit is configured to identify the one or more word lines based on a number of program/erase cycles for the word line.

4. The system of claim 1, wherein:
the control circuit is configured to determine the error threshold based on a temperature associated with the memory array.

5. The system of claim 1, wherein:
the control circuit is configured to determine the error threshold based on a number of program/erase cycles for the word line.

6. The system of claim 1, wherein:
the control circuit is configured to determine the error threshold based on a number of data refreshes that have occurred to the word line.

7. The system of claim 1, wherein:
the control circuit is configured to read the first set of data stored from the set of memory cells.

8. The system of claim 1, wherein:
the fail bit count satisfies the error threshold if the fail bit count is greater than the error threshold;
the memory array comprises a NAND memory array; and
the memory array comprises a non-volatile memory that is monolithically formed in one or more physical levels of memory cells having active areas disposed above a silicon substrate.

9. A method, comprising:
reading a first set of data from a set of memory cells connected to a word line within a memory block;
determining that a number of bit errors associated with the first set of data satisfies an error threshold;
selecting a plurality of word lines within the memory block in response to determining that the number of bit errors associated with the first set of data satisfies the error threshold, the plurality of word lines includes the word line and a second word line that has not been programmed since a last erase operation on the second word line;
erasing the plurality of word lines in response to detecting that the word line has been erased at least a threshold number of times and that the number of bit errors associated with the first set of data exceeds the error threshold; and
programming a second set of data into the plurality of word lines.

10. The method of claim 9, further comprising:
determining the error threshold based on a temperature associated with the memory block.

11. The method of claim 9, further comprising:
determining the error threshold based on a number of program/erase cycles for the word line.

12. The method of claim 9, further comprising:
determining the error threshold based on a number of data refreshes that have occurred to the word line.

13. The method of claim 9, wherein:
the first set of data comprises a page of data and the error threshold comprises three bit errors per page; and
the second word line is adjacent to the word line.

14. The method of claim 9, wherein:
the memory block comprises a NAND memory block; and
the memory block comprises a non-volatile memory that is monolithically formed in one or more physical levels of memory cells having active areas disposed above a silicon substrate.

15. A system, comprising:
a memory array, the memory array includes a set of memory cells connected to a word line;
a control circuit configured to identify a programming operation to be performed on the set of memory cells and detect that a fail bit count associated with the set of memory cells is greater than an error threshold, the control circuit configured to identify one or more word lines within the memory array in response to detecting that the fail bit count is greater than the error threshold, the one or more word lines include the word line and a second word line that has not been programmed since a last erase operation on the second word line;
an erase circuit configured to erase memory cells connected to the one or more word lines such that less than all of the memory cells within the memory array are erased; and
a write circuit configured to write data associated with the programming operation into the memory cells connected to the one or more word lines.

16. The system of claim 15, wherein:
the control circuit is configured to determine the error threshold based on a number of program/erase cycles for the memory array.

17. The system of claim 15, wherein:
the control circuit is configured to identify the one or more word lines based on a number of program/erase cycles for the word line.

18. The system of claim 15, wherein:
the second word line is adjacent to the word line;
the control circuit configured to detect that the word line has been erased at least a threshold number of times; and
the erase circuit configured to erase memory cells connected to the second word line in response to detecting that the word line has been erased at least the threshold number of times and that the fail bit count exceeds the error threshold.

19. The system of claim 15, wherein:
the fail bit count corresponds with a number of memory cells with threshold voltages outside of a threshold voltage range for erased memory cells.

20. The system of claim 15, wherein:
the memory array comprises a NAND memory array; and
the memory array comprises a non-volatile memory that is monolithically formed in one or more physical levels of memory cells having active areas disposed above a silicon substrate.

* * * * *